United States Patent [19]
Kubo et al.

[11] Patent Number: 6,137,135
[45] Date of Patent: Oct. 24, 2000

[54] SEMICONDUCTOR DEVICE AND METHOD OF FABRICATING THE SAME

[75] Inventors: Hirotoshi Kubo, Gunma; Hiroaki Saito, Gifu; Masanao Kitagawa; Eiichiroh Kuwako, both of Gunma, all of Japan

[73] Assignee: Sanyo Electric Co., Ltd., Moriguchi, Japan

[21] Appl. No.: 09/131,345

[22] Filed: Aug. 7, 1998

[30] Foreign Application Priority Data

Aug. 8, 1997 [JP] Japan ................................ 9-215024
Jul. 8, 1998 [JP] Japan ............................... 10-192963

[51] Int. Cl.⁷ .......................... H01L 29/76; H01L 29/94; H01L 31/113; H01L 31/119; H01L 31/062
[52] U.S. Cl. .......................... 257/328; 257/329; 257/341; 438/212
[58] Field of Search ................................ 257/329, 328, 257/341; 438/212

[56] References Cited

U.S. PATENT DOCUMENTS 3,798,514  3/1974  Hayashi et al. ...................... 317/235 R
5,473,176  12/1995  Kakumoto .............................. 257/192
5,714,781  2/1998  Yamamoto et al. ................... 257/329

FOREIGN PATENT DOCUMENTS 55-48968   4/1980   Japan.
7-263692   10/1995  Japan.
7-326741   12/1995  Japan.

*Primary Examiner*—William Mintel
*Attorney, Agent, or Firm*—Armstrong, Westerman, Hattori, McLeland & Naughton

[57] ABSTRACT

The present invention improves the characteristic of a trench-type vertical MOSFET. When a trench 23 serving as a gate 25 is formed, it is made in a shape of "γ" which is convex toward the inside of the trench. Thus, the surface area of the trench is reduced so that both gate-source capacitance and gate-drain capacitance can be reduced, thereby shortening the switching time of the MOSFET.

11 Claims, 16 Drawing Sheets

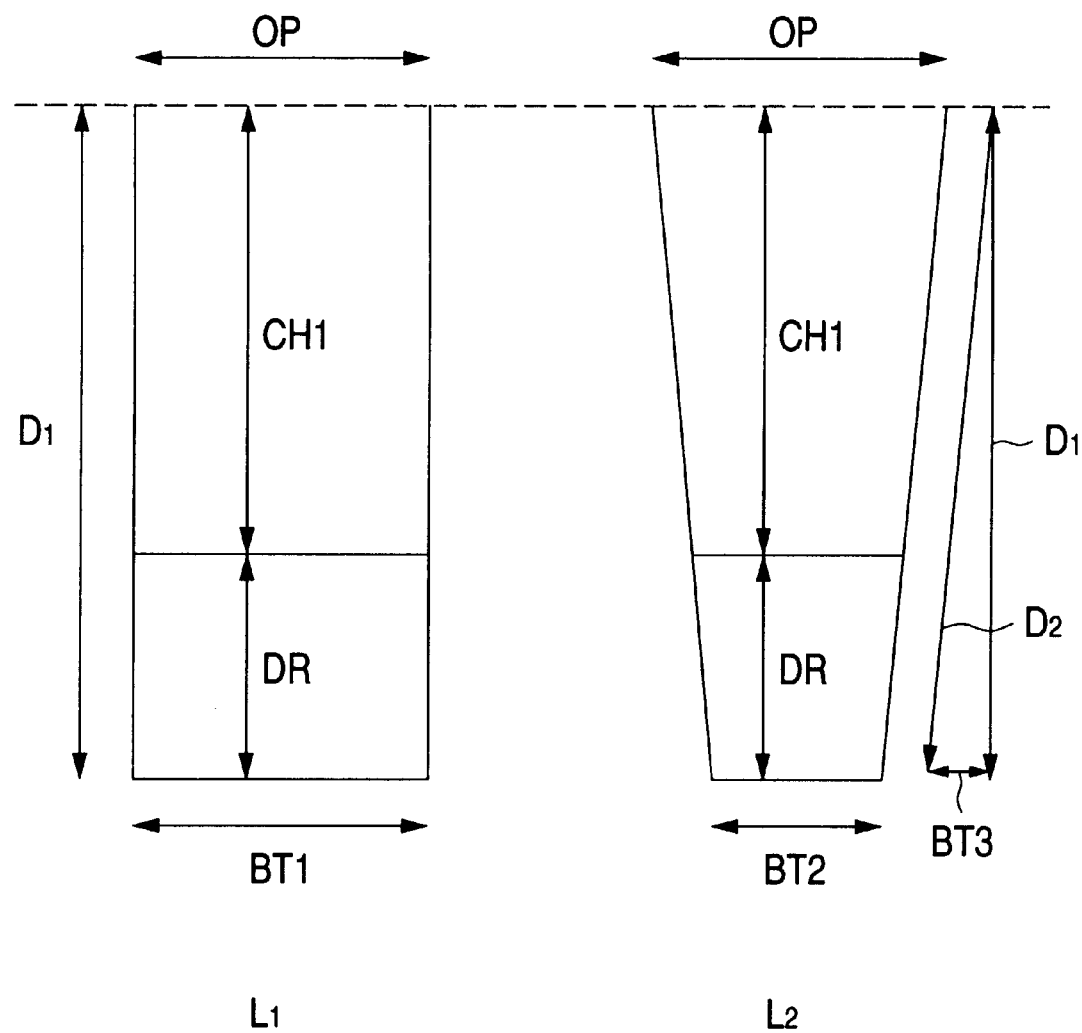

CAPACITANCE CURVE (CELL PITCH: 9μm)

- ● Ciss (U)
- ■ Coss (U)
- ▲ Crss (U)
- ○ Ciss (γ)
- □ Coss (γ)
- △ Crss (γ)

CAPACITANCE CURVE (CELL PITCH: 5μm)

(30 Sec.)

(60 Sec.)

(100 Sec.)

(150 Sec.)

(200 Sec.)

TIME DEPENDENCY OF γ-SHAPE [ μm ]

| ETCHING TIME | GROOVE WIDTH OP | BOTTOM BT2 | DEPTH D1 |
|---|---|---|---|
| 30 | 0.95 | 0.72 | 0.32 |
| 60 | 0.97 | 0.62 | 0.65 |
| 100 | 0.97 | 0.49 | 1 |
| 150 | 0.97 | 0.32 | 1.47 |
| 200 | 0.95 | 0.29 | 1.93 |

SEMICONDUCTOR DEVICE AND METHOD OF FABRICATING THE SAME

BACKGROUND OF THE INVENTION

1. Field of the Invention

The present invention relates to a semiconductor device with a trench, the inner wall of which is covered with a dielectric material and which intends to reduce the capacitance, and a method for fabricating the same.

2. Description of the Related Art

Conventionally, a trench is used as a gate of a vertical MOS transistor such as a power MOSFET.

The trench has two types of structures, i.e. a V (shape)-trench and a U (shape)-trench. For example, as for the former, JP-A-55-48968 mainly relates to a horizontal MOS transistor, but discloses, (refer to FIG. 14 of the JP-A-55-48968), a vertical MOS transistor including a source region (21) formed around a V-trench gate and a drain region (26) of N⁻ type layer disposed at a bottom of the V-trench, namely discloses a V-trench MOS transistor. On the other hand, the latter is disclosed in detail in JP-A-7-326741 and JP-A-7-263692.

For example, in the vertical MOS transistor disclosed in JP-A-7-263692, as shown in FIG. 12 of this application, an N⁻ type semiconductor layer 10 is located on a N⁺ type semiconductor substrate (not shown) and a P type semiconductor layer 11 is formed on the N⁻ type semiconductor layer 10. A trench 12 is formed from the surface of the semiconductor layer 11 so that the bottom and its vicinity is engaged in the N⁻ type semiconductor layer 10.

The inner wall of the trench 12 is covered with a gate insulating layer 13. A conductive material such as polycrystalline silicon (poly-si) 14 is embedded in the trench 12. An N⁺ type source region 15 is formed around the trench 12. A source electrode 17 is formed through the source region 15 and an insulating film 16 surrounded by the source region 15 and formed to expose the surface of the P⁻ type semiconductor layer.

The surface of the semiconductor layer outside the trench 12 between the source region 15 and the drain region 10 is inverted from P type into N type to form a channel so that a current flows from the source region 15 toward the drain side.

In (FIG. 14 of) JP-A-48968, a "V-MOS", having a trench of V-shape is shown. In the V-MOS", an electric field is concentrated into the bottom so that breakage is likely to occur between the gate and drain. In addition, dry etching is difficult to carry out for machining and hence wet etching is commonly adopted. Therefore, the slanting angle of the V-trench is defined according to a crystal face so that the size of the opening cannot be increased. Further, owing to variations in the depth of the trench, $C_{gd}$ varies greatly. This leads to variations in the switching speed.

On the other hand, the "U-trench" of the MOS transistor disclosed in JP-A-7-263692 is machined by dry etching and is a "Round" shape on the bottom. Therefore, unlike the V-trench, an electric field is prevented from being concentrated at the bottom. The capacitance $C_{rss}=C_{gd}$ between a trench bottom and N⁻ type layer, however, is increased, thus retarding the switching speed.

Further, JP-A-7-326741 intends to remove a LOCOS to form a trench, (as shown in its FIG. 2). However, because the oxidizing step is required, the depth of the trench cannot be increased. In addition, owing to the formation of a bird's beak, defects are likely to occur below the bird's beak. When the LOCOS is grown to a deep position in order to increase the channel length, a long oxidizing time is required. Correspondingly, a bird's beak is further grown, and the size of the opening of the trench is increased, thus increasing the capacitance. Further, the cell density cannot be increased and reduction of the on-resistance is difficult.

The present invention intends to solve these problems, particularly to reduce the capacitance and to realize high speed switching while preventing reduction of the cell density.

Assuming that the switching time of the transistor is T, T α $(C_{gs}+C_{gd})$. $C_{gs}$ represents a gate-source capacitance. Since the source electrode is in contact with the P⁺ type semiconductor layer, it also represents the capacitance between the channel region and gate electrode. $C_{gd}$ represents a gate-drain capacitance.

SUMMARY OF THE INVENTION

The present invention intends to reduce the capacitance to improve the switching characteristic.

The present invention has been accomplished in view of the problem described above, and first, intends to solve the problem in such a manner that the inner wall of the trench extending from a bottom of the trench to the surface of the semiconductor layer has a slope, and an angle of a tangent line of the slope formed with the surface of the semiconductor layer decreases constantly from the vicinity of a lower end of the channel region toward the surface of the semiconductor layer.

As shown in FIG. 11, if angles of a tangent line of the slope for the surface of a semiconductor substrate, α1, . . . . . . αn . . . are decreased toward the surface of the semiconductor substrate, the trench can have a sectional shape which is convex toward the inside of the trench. Further, the circumferential length of slope shaped trench as shown in FIG. 14B is small in comparison with that of the conventional rectangular type trench as shown in FIG. 14A. Namely a slope can be formed to reduce the circumferential length of the trench. The structure of the trench according to the present invention is referred to as "γ trench" in view of similarity of the shape.

A first aspect of the device is a semiconductor device of the present invention, which comprises:

a trench formed in a semiconductor layer of a first conduction type;

a gate oxide layer formed on an:inner wall of said trench;

a gate conductor material embedded in said trench covered with the gate oxide layer; and a channel region formed in a boundary of said semiconductor layer with said gate oxide layer, wherein the inner wall of the trench extending from the bottom of said trench to the surface of the semiconductor layer has a slope, and an angle of a tangent line of said slope formed with the surface of said semiconductor layer decreases constantly from the vicinity of a lower end of said channel region toward the surface of said semiconductor layer.

As cell density is higher, although on-resistance is generally decreased, capacitance is increased. Contrary that, according to this device structure, capacitance can be decreased, even if the cell density is same as that of the conventional structure and thereby on-resistance remains the same as the conventional structure.

A second aspect of the device is a semiconductor device according to the first aspect, wherein said semiconductor layer is a first semiconductor layer of a first conduction type and said semiconductor device further comprises:
  a source region formed on a surface of said first semiconductor layer;
  a drain region of a second semiconductor layer of an opposite conduction type formed on a rear surface of said first semiconductor layer.

A third aspect of the method is a method of fabricating a semiconductor device and intends to solve the problem in such a manner of making etching with anisotropy stronger in a vertical direction with a deposit applied on a side wall to form the trench having a shape such that an angle of a tangent line of the slope formed with the surface of the semiconductor layer decreases constantly from the vicinity of a lower end of the channel region toward the surface of the semiconductor layer. This makes the etching speed in a vertical direction higher than in a horizontal direction, thereby completing the γ trench. According to the method, adding to the effect according to the device above described, owing to the existence of the deposit applied on the side wall of the trench, without changing an opening width, capacitance can be reduced even in the conventional design scale as shown in FIG. 22.

A fourth aspect of the method is a method of fabricating a semiconductor device, intends to solve the problem in such a manner that an area of the trench, when it is cut horizontally, has an increasing rate from the lower end of the channel region toward the surface of the semiconductor substrate and a substantially zero increasing rate in the vertical vicinity of the lower end of the channel region. Thus, even if the depth of the trench varies, a variation of $C_{gd}$ at the portion with the area increasing rate of substantially zero can be minimized.

A fifth aspect of the method is a method of fabricating a semiconductor device, and intends to solve the problem in such a manner that assuming that a vertical section of the trench has a length OP of an opening, a depth $D_1$, a width $BT_2$ of a bottom and a length $D_2$ of a sloping line connecting the edge of the opening to that of the bottom, a dimension relationship: $2 \times D_2 + BT_2 < 2 \times D1 + OP$ is set.

A sixth aspect of the device is a semiconductor device, and intends to solve the problem in such a manner that the inner wall of the trench extending from a bottom of the trenches from the surface of the semiconductor layer has a slope, and an angle of a tangent line of the slope formed with the surface of the semiconductor layer decreases constantly from the vicinity of a lower end of the channel region toward the surface of the semiconductor layer.

As described above, the trench has a section of γ shape, has a grid pattern in its planar shape. The trench has a structure in which the circumferential shape as shown in FIG. 14B is continuous vertically to the paper face. As compared with the U trench as shown in FIG. 14A, the circumferential length of the slope shaped trench can be reduced to decrease the resultant capacitance. This improves the switching speed of the vertical MOS transistor. By making the trench convex toward the inside thereof, $BT_2$ of the bottom can be made smaller than the shape as shown in FIG. 14B, thereby decreasing the resultant capacitance C (GD)=$C_{rss}$.

A seventh aspect of the device is a semiconductor device, and intends to solve the problem in such a manner that an area of the trench, when it is cut horizontally, has an increasing rate from the lower end of the channel region toward the surface of the semiconductor substrate and a substantially zero increasing rate in the vertical vicinity of the lower end of the channel region. Even if there is a certain variation of the depth of the trench, a variation of the surface area of the trench overlapping the drain region can be suppressed. Therefore, the capacitance C (GD)=$C_{rss}$ generating at the bottom of the trench can be made small with a slight variation.

An eighth aspect of the device is a semiconductor device, and intends to solve the problem in such a manner that assuming that a vertical section of the trench has a length of an opening of OP, a depth of $D_1$, a width of a bottom of $BT_2$ and a length of a line connecting the edge of the opening to that of the bottom, a relationship $2 \times D_2 + BT_2 < 2 \times D_1 + OP$ is set.

A ninth aspect of the device is a semiconductor device, and intends to solve the problem in such a manner that a bottom of the trench overlaps the vicinity of the surface of the second layer. According to the structure, by being able to reduce an overlapped area between the bottom of the trench and the second layer, $C_{gd}$ can be reduced and therefore $C_{rss}$ can be reduced.

A tenth aspect of the device is a semiconductor device, and intends to solve the problem in a vertical type MOS semiconductor device in such a manner that the trench has a sectional shape having a dimension relationship: $D_2 < D_1 + (OP - BT_2)/2$ where OP: a length of an opening of the trench,
  $D_1$: a depth of the trench,
  $D_2$: a length of a sloping line connecting the edge of the opening to that of a bottom of the trench,
  $BT_2$: a length of the bottom.

This aspect is based on the fact that the length of hypotenuse (one side) of a right triangle is smaller that the total of the remaining two sides. Specifically, by cutting both ends of the U trench to leave an area of a triangle indicated by arrows, a circumferential length can be shortened necessarily.

An eleventh aspect of the device is a semiconductor device, and intends to solve the problem in a vertical type MOS semiconductor device having a trench formed in a semiconductor layer and embedded with a gate material through a gate oxide layer on the inner surface of the trench, a source region (or drain region) formed on the periphery of an opening of the trench and a drain region (or source region) formed in the vicinity of a bottom of the trench, in such a manner that the trench has a slope which is convex toward above from a line connecting point S, which is a crossing point of the bottom of the source region (or drain region) and the trench, to point d, which is a lower end of a channel region formed in a boundary of the semiconductor layer with the gate insulating layer, and is substantially vertical (Refer to FIG. 24) in the vertical vicinity of the lower end of the channel region. According to this structure, channel length can be lengthened and thereby a breakdown voltage between source and drain is improved.

A twelfth aspect of the device is a semiconductor device, and intends to solve the problem in such a manner that the bottom of the trench has a prescribed width. According to this structure, concentration of the electric field, caused in the vicinity of the bottom of the trench, is prevented.

A thirteenth aspect of the device is a semiconductor device, and intends to solve the problem in such a manner that the MOS semiconductor device is a power MOS transistor.

A fourteenth aspect of the device is a semiconductor device, and intends to solve the problem in such a manner that the MOS semiconductor device is an IGBT(Insulating Gate typed Bipolar Transistor). IGBT has a structure similar to the power MOS, and the difference is only the conduction type of the substrate.

A fifteenth aspect of the method is a method of fabricating a semiconductor device, and intends to solve the problem in such a manner that the trench is etched using HBr as a main etching gas (a first effective species).

A sixteenth aspect of the method is a method of fabricating a semiconductor device, and intends to solve the problem in such a manner that the trench is made using a main etching gas of HBr mixed with He, $O_2$ and $N_2$ and at an adjustable etching rate.

A seventeenth aspect of the method is a method of fabricating a semiconductor device, and intends to solve the problem in such a manner of forming a film having resistance to dry etching on a surface of a semiconductor layer;

making an opening in the film to expose a region of the semiconductor layer corresponding to a trench to be formed; and etching the region of the semiconductor layer corresponding to the opening using HBr as a main etching gas at a substantially uniform etching rate in a depth direction of the trench and a decreasing reduction rate of the width of the bottom according an increasing depth of the trench.

BRIEF DESCRIPTION OF THE INVENTION

FIGS. 14A and 14B are explanation views for computing the capacitances in a U-shape trench and a γ-shape trench.

PREFERRED EMBODIMENTS OF THE INVENTION

Prior to description of a embodiment of the invention, firstly we explain with respect to the two trench structures, conventional U-shape trench and γ-trench of the present invention.

Referring to FIGS. 14A, and 14B, the trench shown in FIG. 14A, formed in an conventional ideal U-structure, adopts a square shape. The trench shown in FIG. 14B, γ-trench of the present invention, adopts an inverted trapezoid shape.

Figure 1:
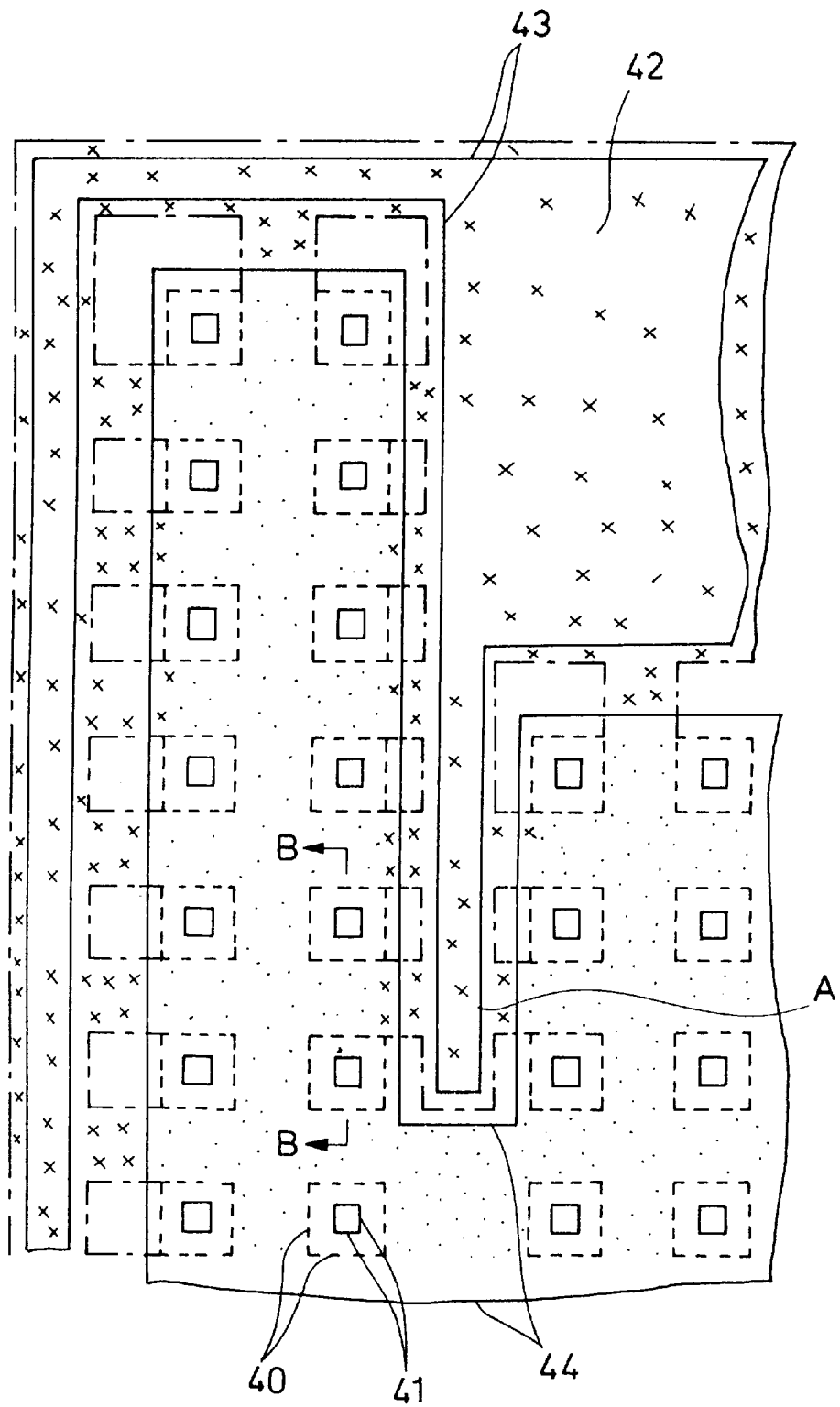
FIG. 1 is a plan view for explaining a first embodiment of the present invention.
Figure 2:
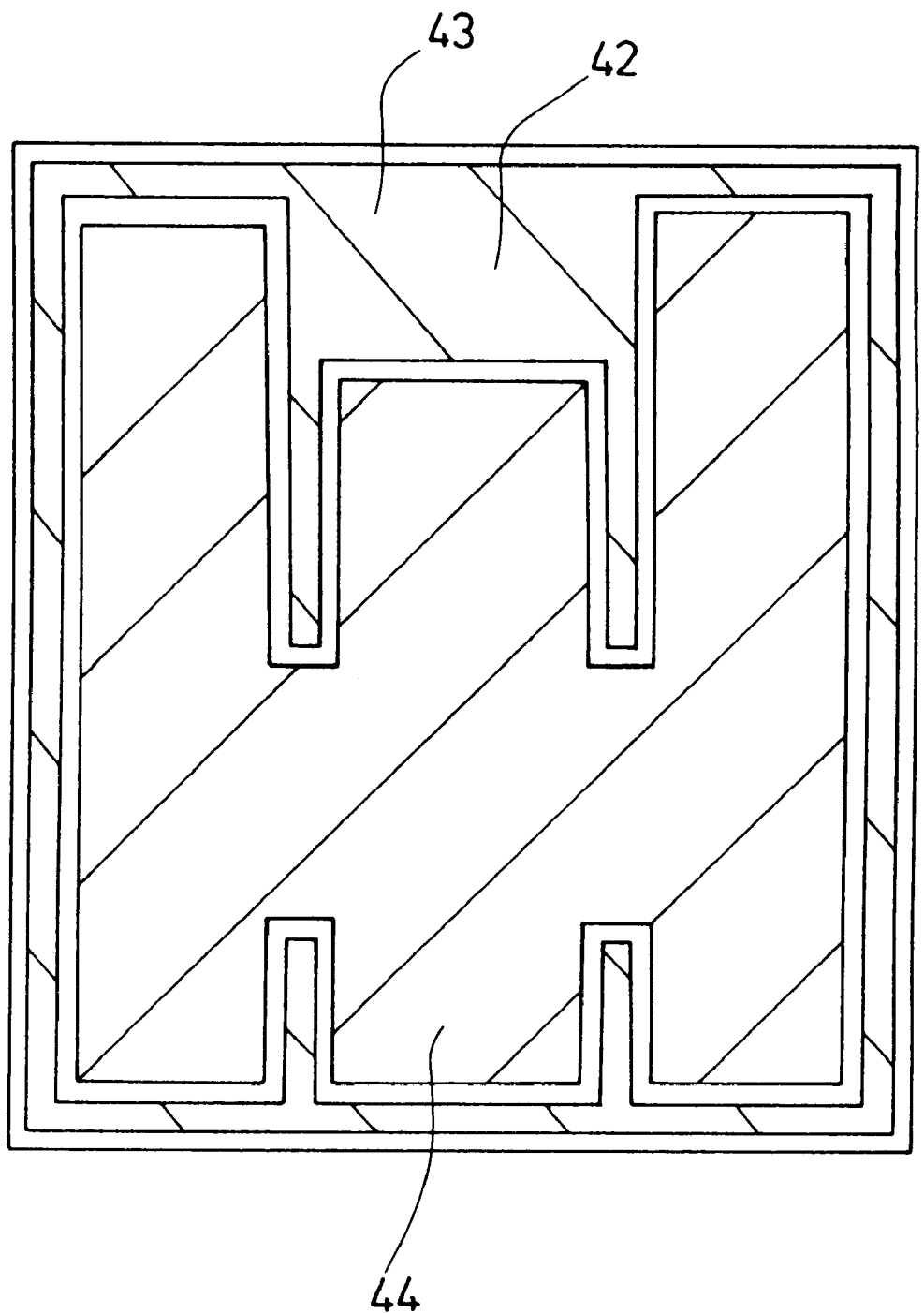
FIG. 2 is a schematic plan view of a semiconductor device for explaining the first embodiment of the present invention.

The vertical power MOS transistor described later has a gate arranged in a grid pattern (FIGS. 1, 2). The periphery indicated in solid line is continuous vertically with respect to paper (FIG. 2). Shortening of the peripheral length by giving a gradient permits the capacitance of $C_{gd}$ to be reduced (FIG. 14).

Namely, in the U-trench, $L_1=2\times D_1+BT_1$ affects generation of capacitance ($C_{iss}=C_{gs}+C_{gd}$). In the trapezoid trench, $L_2=2\times D_2+BT_2$ affects generation of capacitance ($C_{iss}$). DR indicates a segment overlapping the drain region. The shape formed by arrows on the right side is a triangle so that $D_2<D_1+BT_3$. Therefore $D_2-D_1<BT_3$. Necessarily, $L_2$ is shorter than $L_1$. This permits the capacitance to be reduced.

For example, assuming that $OP=BT_1=1.3$ μm, $D_1=3$ μm, $BT_2=0.75$ μm, $CH_1=2$ μm, $L_1=7.3$ μm and $L_2=6.77$ μm. Thus, the capacitance $C_{iss}$ can be reduced by about 7%. Further, since $2\times DR+BT_1=3.3$ μm and $2\times D_2+BT_2=2.75$ μm $C_{rss}$ can be decreased by 16.7%.

Figure 15:
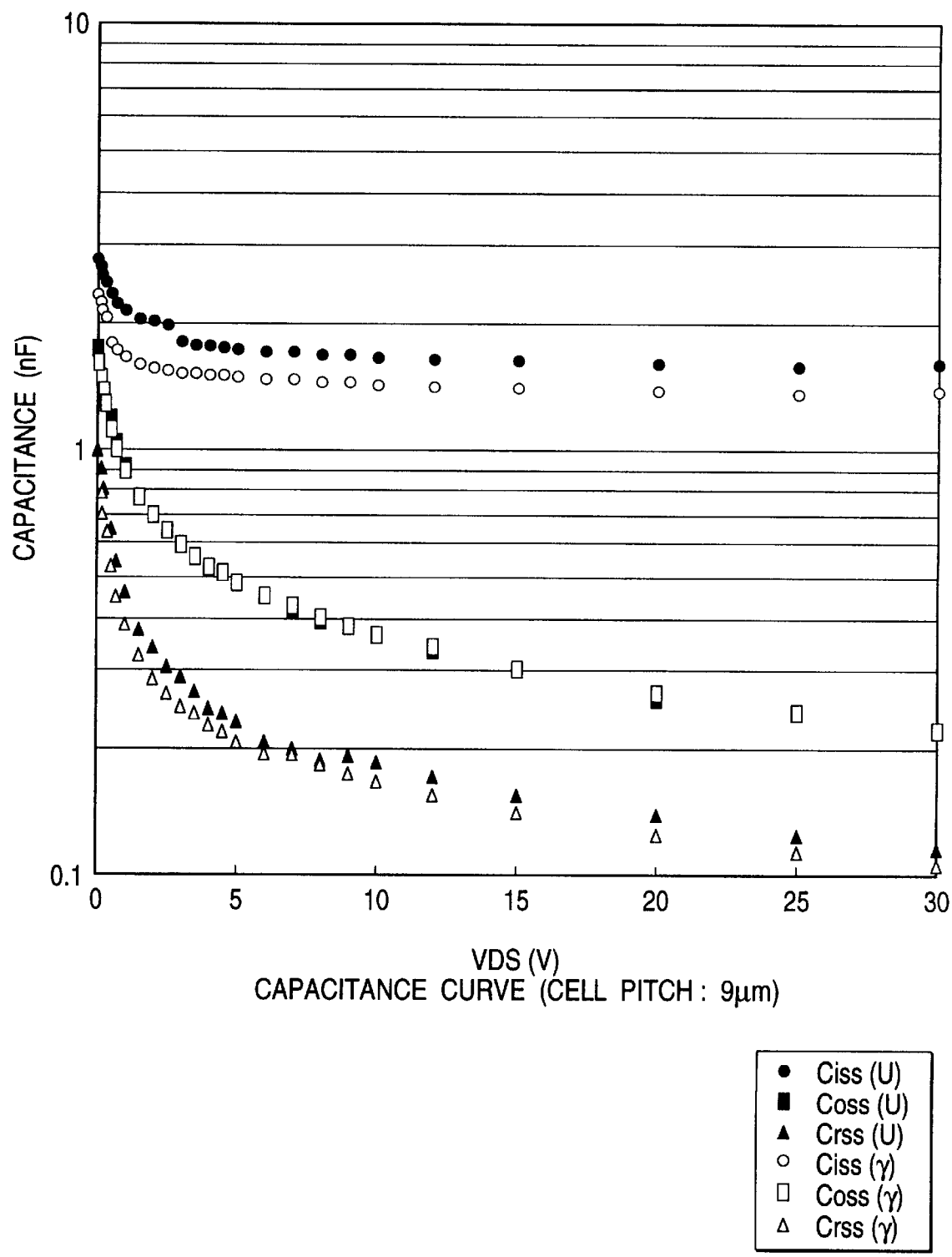
FIG. 15 is a graph showing the computing result of relationship between source-drain voltage and the capacitance in the U-shape trench and the γ-shape trench of FIGS. 14A and 14B (cell pitch: 0.5 μm).
Figure 16:
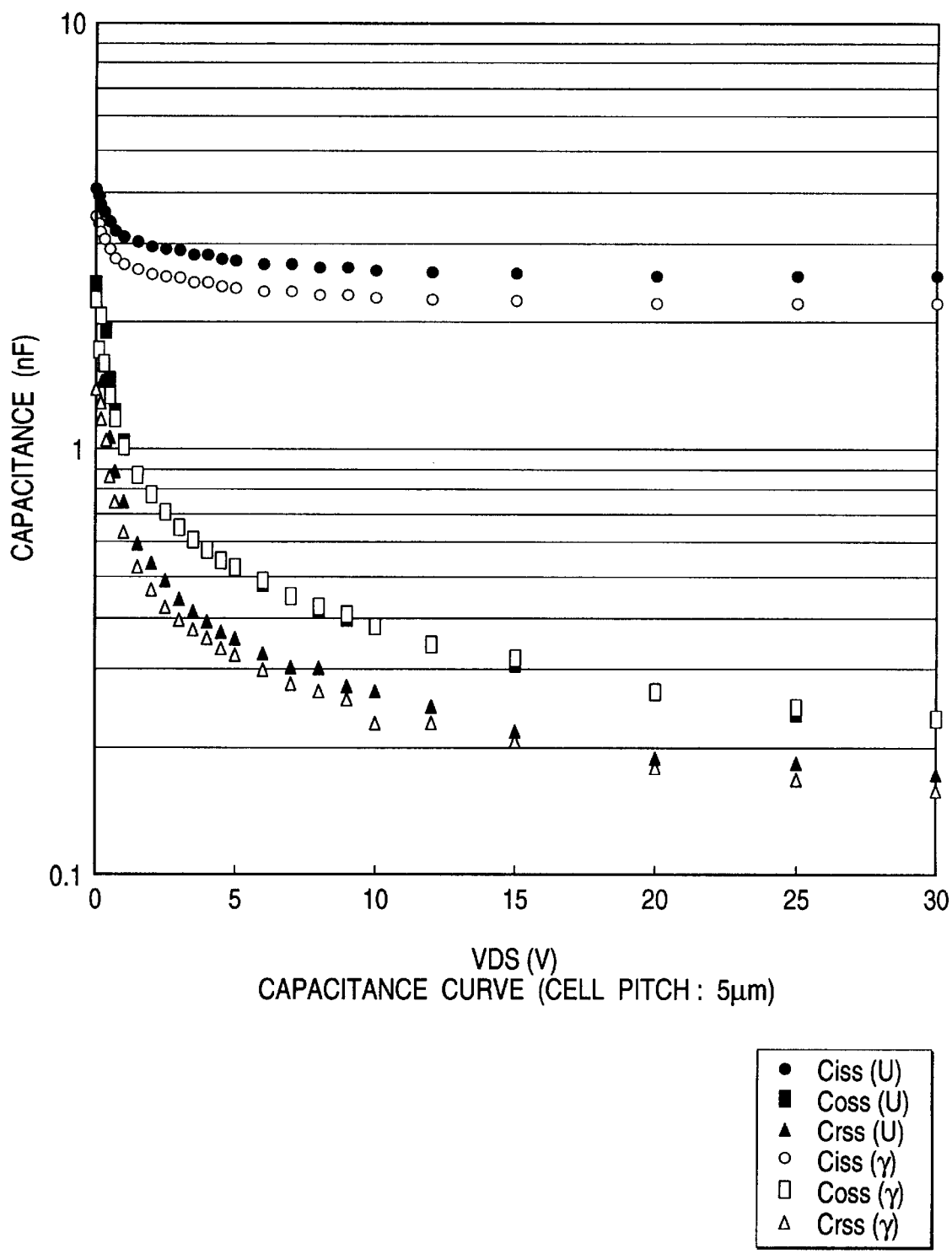
FIG. 16 is a graph showing a computing result of relationship between source-drain voltage and the capacitance in the U-shape trench and the γ-shape trench of FIGS. 14A and 14B (cell pitch: 0.9 μm).
Figure 17:
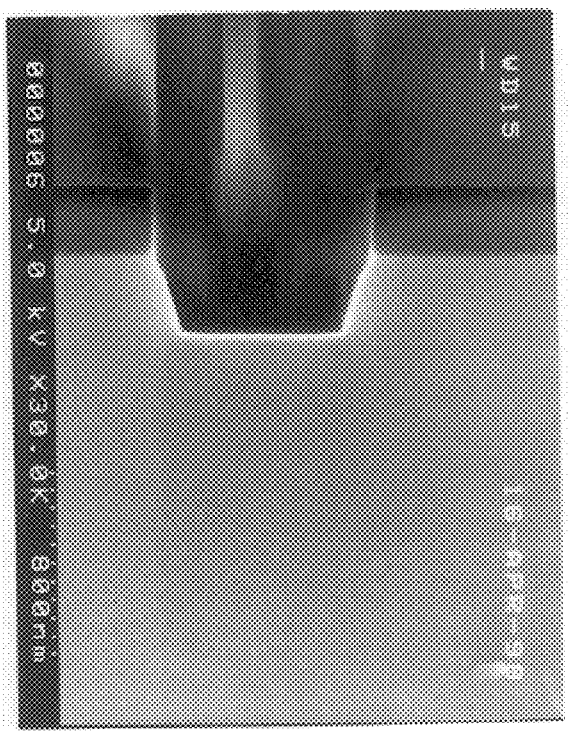
FIG. 17 is a SEM photograph for explaining the shape of a γ-shape trench realized by only anisotropic etching (for 30 sec).
Figure 18:
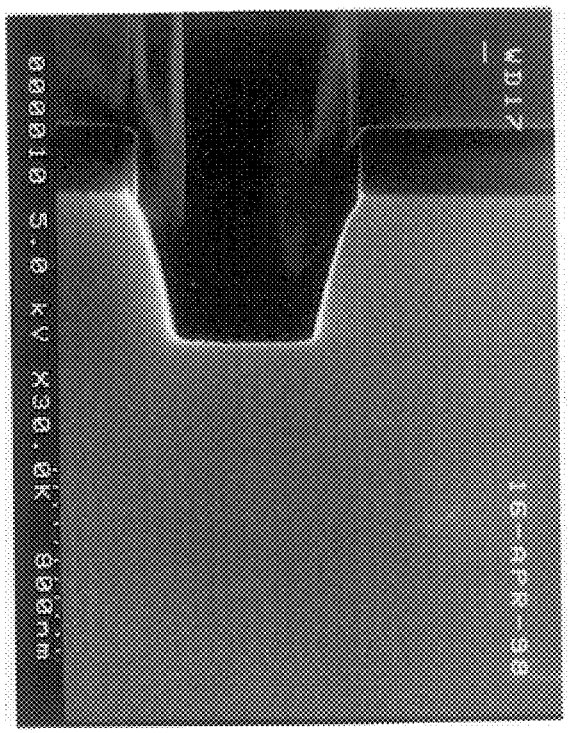
FIG. 18 is a SEM photograph for explaining the shape of a γ-trench realized by only anisotropic etching(for 60 sec).
Figure 19:
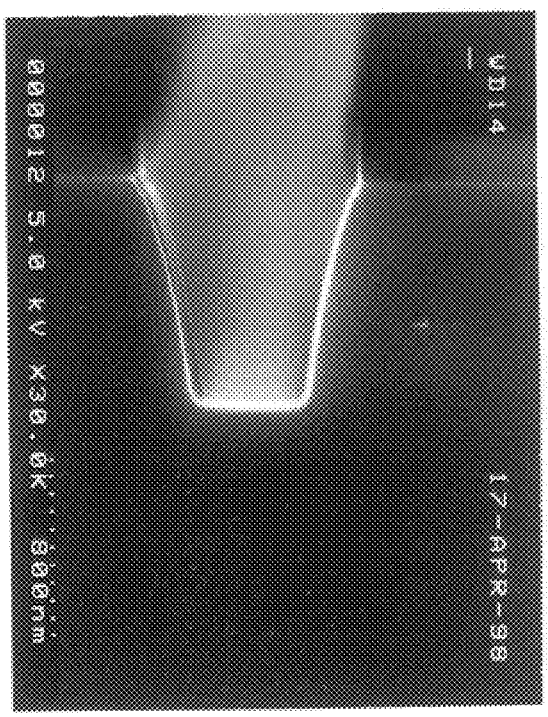
FIG. 19 is a SEM photograph for explaining the shape of a γ-shape trench realized by only anisotropic etching (for 100 sec).
Figure 20:
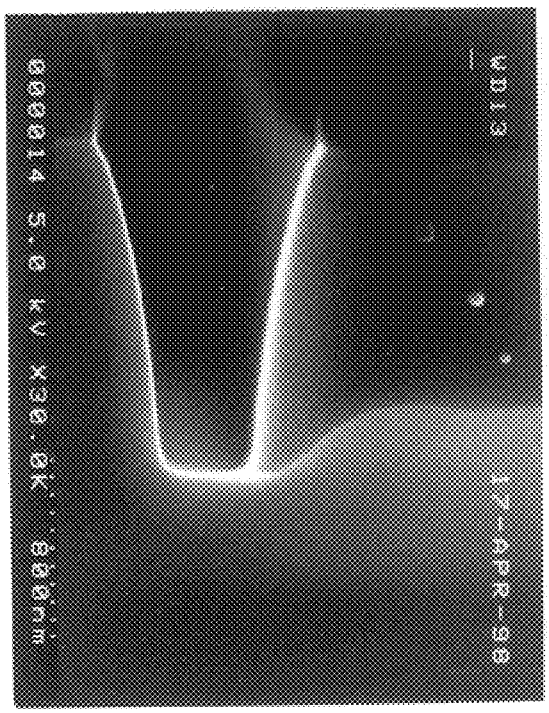
FIG. 20 is a SEM photograph for explaining the shape of a γ-trench realized by only anisotropic etching(for 150 sec).
Figure 21:
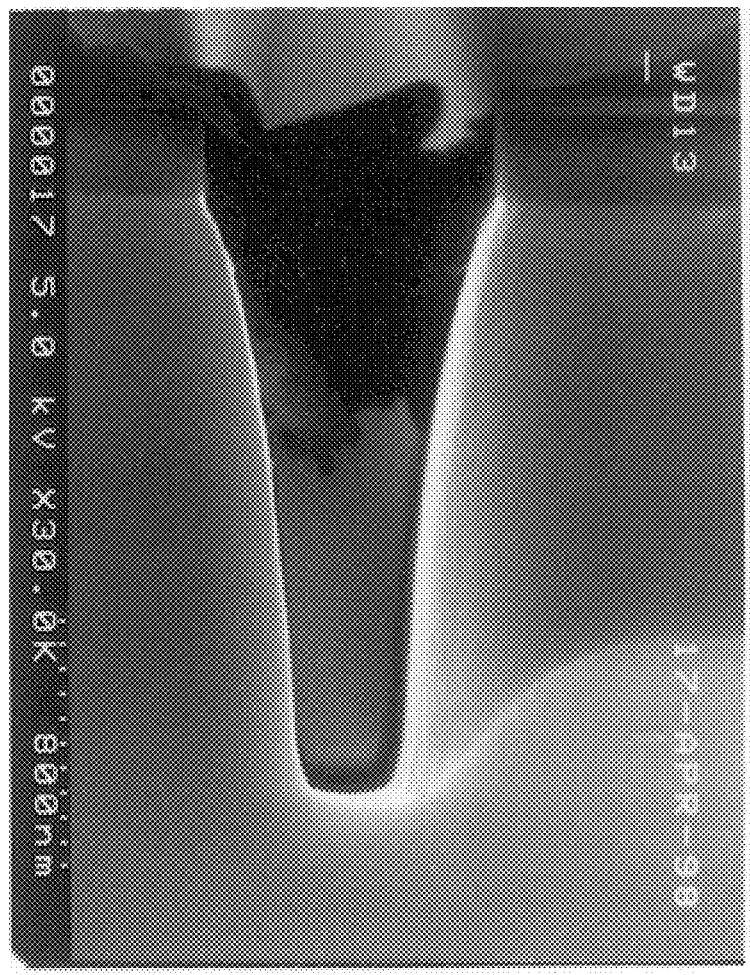
FIG. 21 is a SEM photograph for explaining the shape of a γ-trench realized by only anisotropic etching(for 200 sec).

The experimental results are shown in FIGS. 15 and 16. It can be seen that $C_{rss}$ is substantially coincident on a computed value. On the other hand, $C_{iss}$ is further reduced from the computed value. This may be attributable to the cause other than the shape. Now, $C_{iss}=C_{gs}+C_{gd}$, $C_{oss}=C_{gd}+C_{ds}$, and $C_{rss}=C_{gd}$. Generally, both $C_{iss}$ and $C_{rss}$ affect the switching speed. Particularly, $C_{rss}$ in the trench affects the charging time at the start of turn-on and the discharging time at the time of turn-off. In total, the switching speed of the vertical power MOS transistor can be increased.

As a result of the experiment, the rising time Td (ON) of the U-trench is 1.5 nsec, whereas that of the γ-trench is 1.2 nsec.

Figure 10:
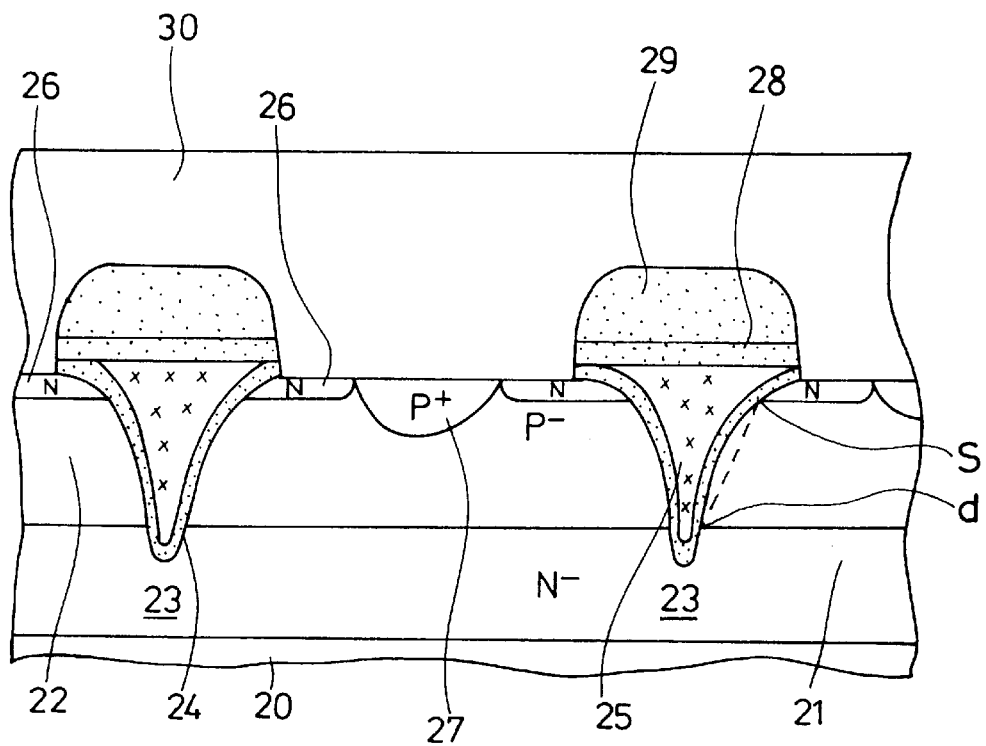
FIG. 10 is a sectional view for explaining a method of fabricating a semiconductor device which is the first embodiment of the present invention.

Referring to FIGS. 1 and 10, an explanation will be given of the first embodiment of the present invention.

The present invention can be applied to a power MOS and IGBT with a gate embedded in a trench. Now, as an example, an explanation will be given of an N-type channel vertical MOS transistor.

As seen from FIG. 10, an N⁻ type epitaxial layer 21 is formed on an N type semiconductor substrate 20. On the surface of the epitaxial layer 21, a P⁻ type diffused layer 22 is formed by the ion implantation or vapor phase diffusion technique. A trench 23 will be etched in trapezoid shape as shown in FIG. 14B or γ shape by the technique described later. The inner surface of the trench is covered with a gate oxide layer 24. Poly-Si is embedded in the trench to form a gate 25. On the periphery of the opening of the trench 23, an N type source region 26 is formed. In the surface of a region of a diffused layer 22, the region of which is surrounded by the source region, a P⁺ type contact region 27 used for application of a back gate is formed. An electrode 30 is formed on insulating layers 28 and 29 over the gate 25. Thus, because of the voltage applied to the gate 25, the conduction type of the channel region between the source region 26 and drain region (N⁻ type layer 21) is inverted into an N type so that a current flows vertically.

FIG. 1 is a plan view corresponding to FIG. 10 and shows the portion of substantially ¼ of upper left of the chip shown in FIG. 2 and having a shape symmetrical vertically and horizontally. Only four cells from the left side are shown, but actually a greater number of cells are present in columns.

In FIG. 1, a square 40 indicated by dotted line represents the source region encircled by the trench 23. The trench is formed in a grid pattern. A small square 41 indicated by solid line inside the contact region represents the P⁺ type contact region. Therefore, in the space between the square 40 in dotted line and square 41 in solid line, the N type source region 26 is formed.

As described above, the gate 25 in a grid pattern is formed so as to surround the square 40 in dotted line. The gate is also formed in zones surrounded by dotted line and one-dot chain line. The zone is classified into two kinds of regions hatched in dots and in x marks. The area hatched by dots corresponds to the trench 23 in FIG. 10. The zone extending from the area hatched by dots to the area hatched in x marks corresponds to the area where poly-Si embedded in the trench 23 is extended to the surface of an epitaxial layer. Reference numeral 42 denotes a bonding pad portion of the gate.

FIG. 2 explains the gate electrode 43 and source electrode 44 (area corresponding to reference numeral 30 in FIG. 10). The area shaded as the gate electrode serves to contact with the gate 43 formed in the trench formed in a grid pattern below the source electrode 44. This area corresponds to the portion of poly-Si extended over the surface of the epitaxial layer, i.e. the area indicated by x marks in FIG. 1. The poly-Si of the area indicated by x marks is formed in an intricated M or W pattern toward the center and the periphery of the chip and is connected to the gate electrode disposed below the source electrode to reduce the gate resistance.

An explanation will be given of a method of fabricating the semiconductor device according to the present invention.

Figure 3:
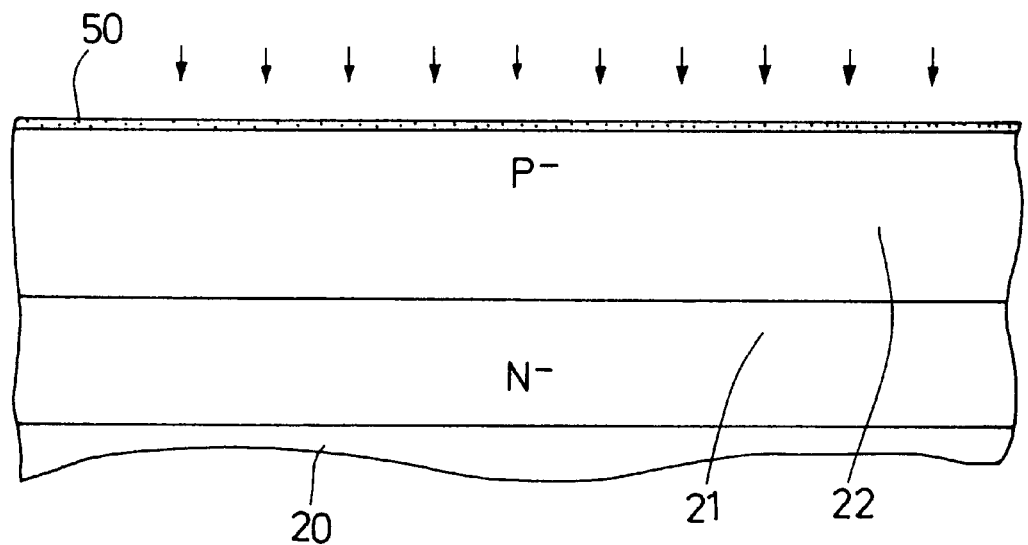
FIG. 3 is a sectional view for explaining a method of fabricating a semiconductor device which is the first embodiment of the present invention.

First, as seen from FIG. 3, an N⁻ type epitaxial layer 21 is formed on an N type semiconductor (Si) substrate 20. On the surface, a P⁻ type diffused layer 22, which may be an epitaxial layer) is formed. In this embodiment, the layer 22 was formed by ion-implantation of boron through a thin oxide layer 50, but may be also formed by being diffused from the impurity layer formed by deposition.

Figure 4:
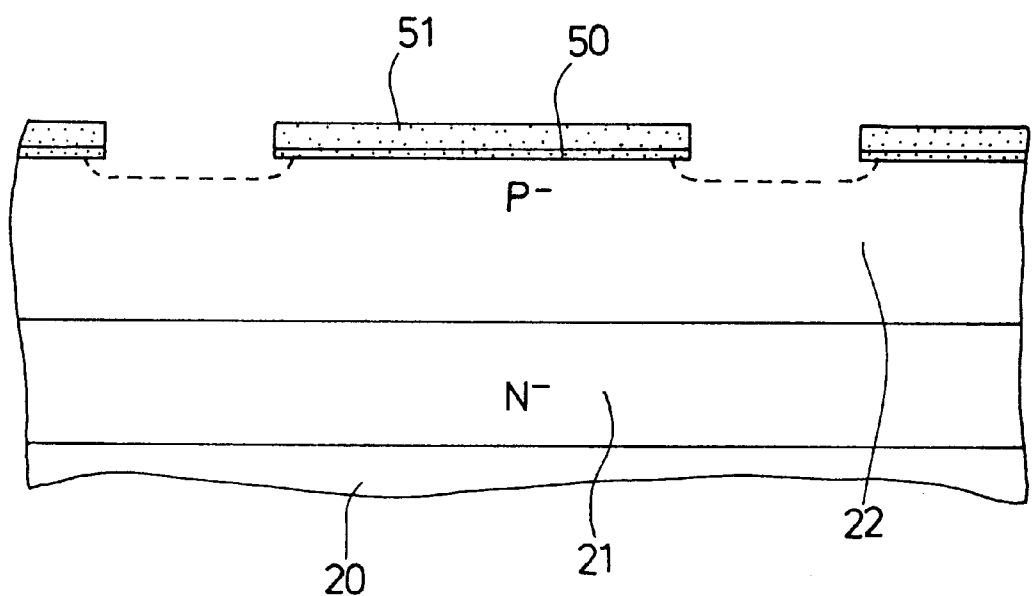
FIG. 4 is a sectional view for explaining a method of fabricating a semiconductor device which is the first embodiment of the present invention.

As shown in FIG. 4, an NSG (Non doped Silicate Glass) film 51 is deposited on the thin oxide layer 50 on the entire surface. The oxide layer 50 and NSG film 51 are etched away to expose the area corresponding to the trench 23 to be formed. The Si substrate is further dry-etched. Specifically, using an inert gas such as $N_2$ gas, He or argon, isotropic sputter etching is carried out.

Figure 5:
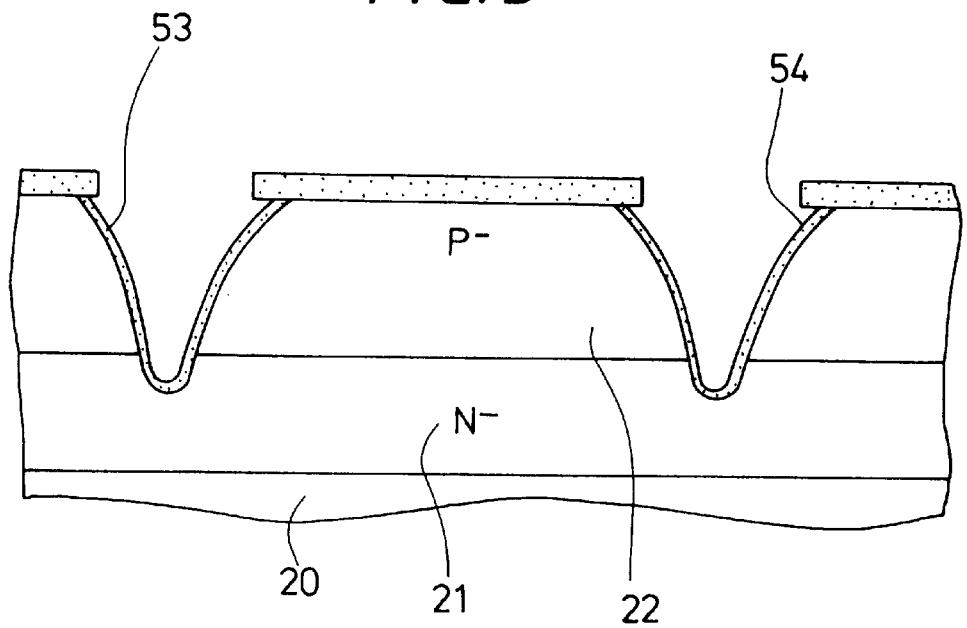
FIG. 5 is a sectional view for explaining a method of fabricating a semiconductor device which is the first embodiment of the present invention.

As seen from FIG. 5, by anisotropic etching using HBr as a main etching gas, a γ-trench is formed which has a convex shape toward the inside in the trench 23.

The present invention is characterized by such a configuration. Because of adoption of the γ-trench, the present invention can reduce the capacitance among the poly-Si 55 embedded in the trench, gate oxide layer 53 formed in the trench surface and semiconductor layer 21.

As described above, the dimension of the γ-trench can be expressed equivalently by $D_2-D_1<BT_3$ in FIG. 14. The circumferential distance $L_2$ of the γ-trench is shorter than the circumferential distance $L_1$ of the U-trench. For this reason, the capacitance can be reduced.

The convex shape of the trench is adjusted. Specifically, assuming that $D_2$ and $BT_2$ represent the actual lengths of the side and bottom of the γ-trench, it must be adjusted so that $2 \times D_2+BT_2$ is smaller than $2 \times D_1+OP$.

The convex shape of the γ trench permits the length of the bottom ($BT_2$ in FIG. 14) to be further reduced. As understood from FIGS. 17–21, by modifying the slope in a convex shape toward the inside of the trench, the width of the trench overlapping the drain region can be reduced. In addition, since the side of the trench overlapping the drain region is formed at an angle (80°–90°) nearly equal to the right angle, even if the depth of the trench varies, the charging rate of capacitance ($C_{rss}$) can be depressed.

In FIG. 4, isotropic etching was carried out through the sputter etching using the $N_2$ gas. However, wet etching or reactive dry etching may be adopted as long as the trench indicated by dotted line is etched isotopically. The reactive etching may use $CF_4$ as a main etching gas.

Figure 11:
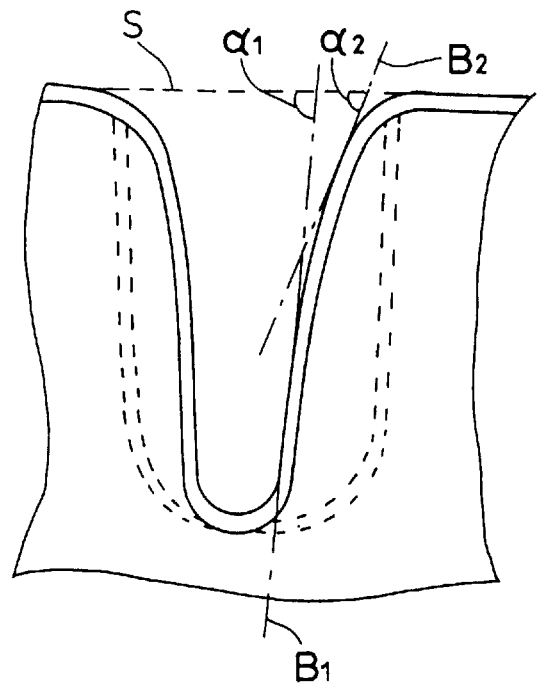
FIG. 11 is a view for explaining the structure of a trench of the present invention.
Figure 12:
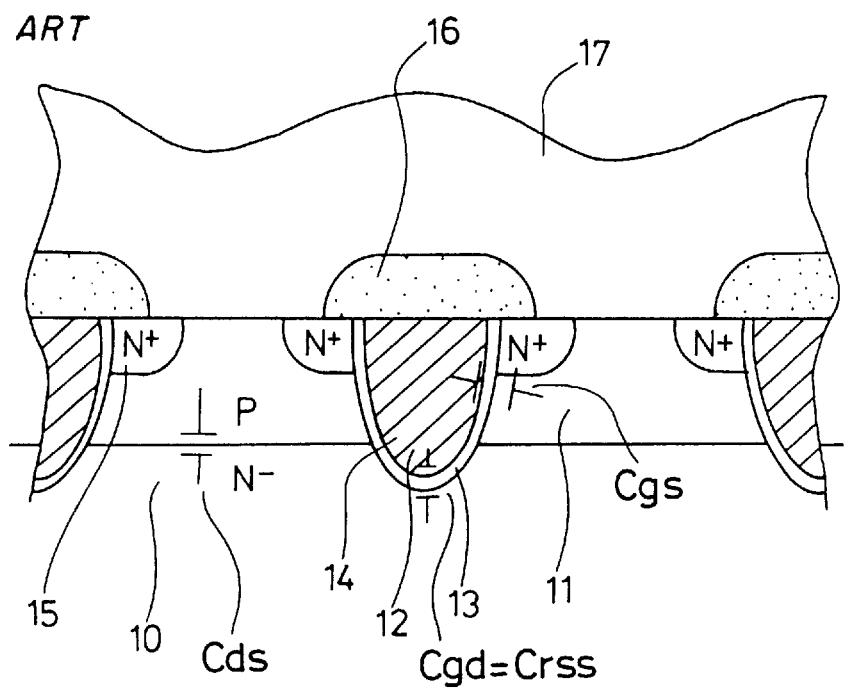
FIG. 12 is a sectional view for explaining a conventional semiconductor device.
Figure 13A:
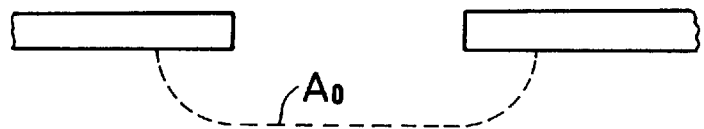
FIGS. 13A–13E are views for explaining the principle of forming a trench.
Figure 13B:
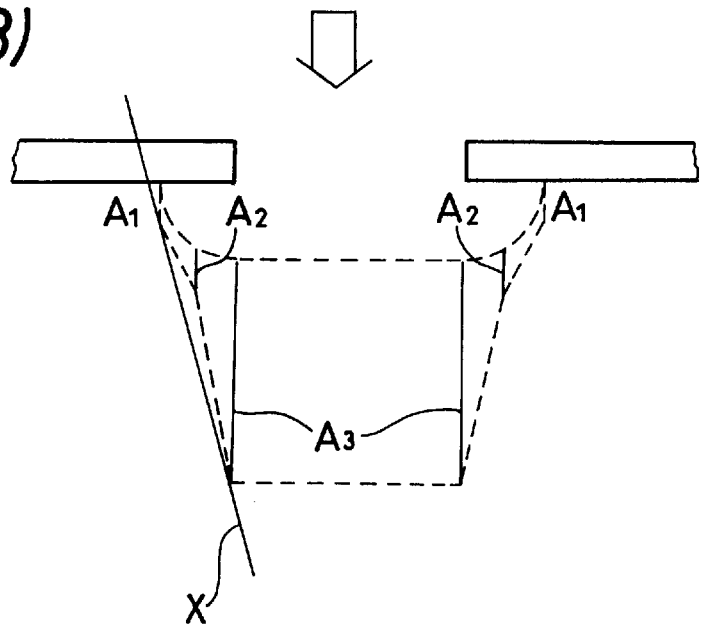

The actual shape of the trench 23 is such as indicated by solid line in FIG. 11. The principle of forming the trench cannot be explained clearly. However, referring to FIGS. 13A and 13B, it will be explained schematically.

After a trench is formed as indicated in dotted line A0 by the isotropic etching, the anisotropic etching is carried out. In the anisotropic etching, the vertical etching rate is much higher than the horizontal etching so that the deposit remains on the side wall. Now assuming that $A1 \leq A2 \leq A3$, a convex trench is formed above segment X. Namely, in FIG. 11, the angles $\alpha 1, \alpha 2 \ldots$ formed by sloping tangent lines B1, B2, . . . and the substrate surface S become smaller from the bottom toward the surface. In addition, the area indicated by reference numeral 54 in FIG. 5, i.e. area successive to the substrate surface forms a more gentle slope than the conventional structure. This contributes to prevent concentration of an electric field at the corner of the opening of the trench.

After the γ-trench is formed as shown in FIG. 11, the trench surface is sacrificially oxidized in order to remove the damage of the anisotropic etching. The oxide layer is removed by wet etching. Thereafter, as shown in FIG. 5, a gate oxide layer 53 is grown. In this case, through the "dummy oxidation", the curve indicated by 54, bottom and corner of the bottom are formed to make a more gentle slope.

Figure 6:
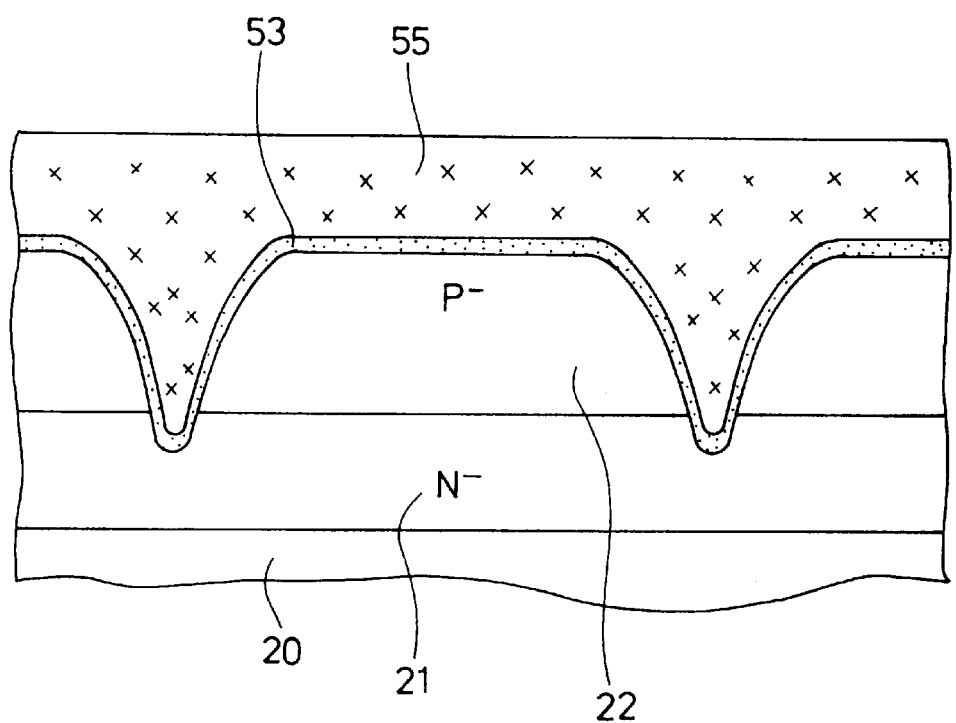
FIG. 6 is a sectional view for explaining a method of fabricating a semiconductor device which is the first embodiment of the present invention.

As shown in FIG. 6, non-doped poly-Si 55 is embedded in the trench, and by ion implantation or diffusion from impurity layer formed by deposition of POCl$_3$, impurities are doped into the poly-Si. In this case, the doped poly-Si may be used.

It should be noted that since the volume of the γ-trench is reduced, the embedding time and diffusion time can be shortened to reduce the time required for the processing step.

Figure 7:
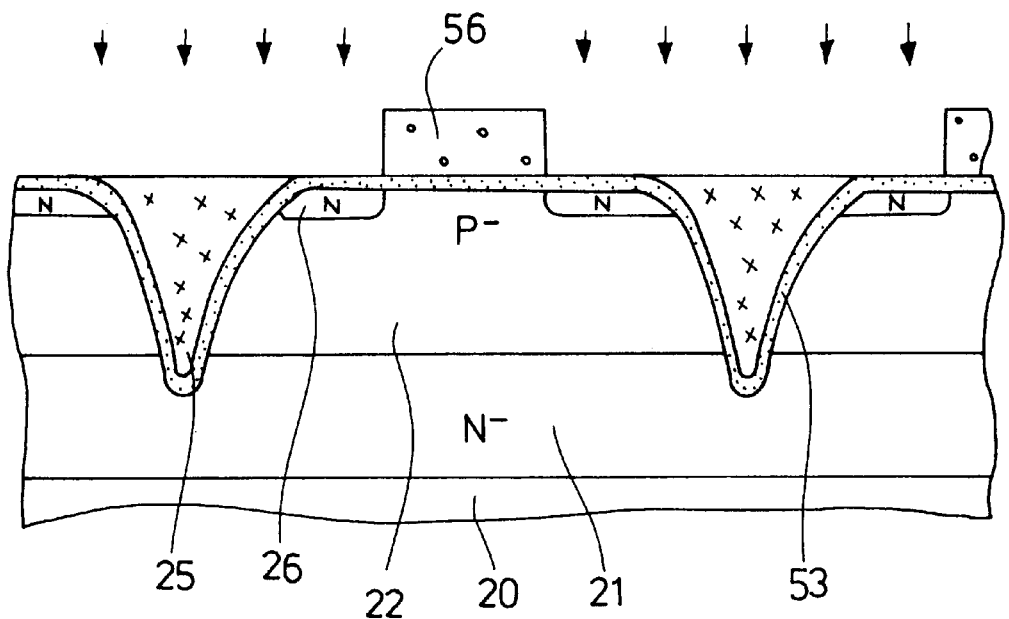
FIG. 7 is a sectional view for explaining a method of fabricating a semiconductor device which is the first embodiment of the present invention.
Figure 8:
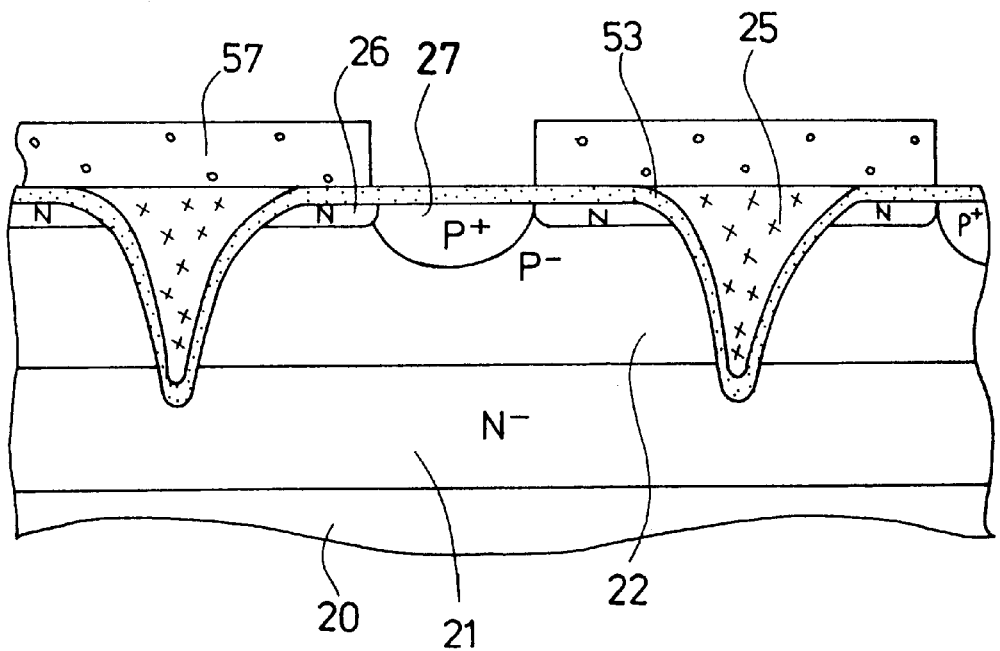
FIG. 8 is a sectional view for explaining a method of fabricating a semiconductor device which is the first embodiment of the present invention.

As shown in FIG. 7, after the poly-Si is etched back to be flattened, a mask 56 for ion implantation is formed. The mask 56 exposes the poly-Si corresponding to the gate 25 and the source region 26 to be formed. N type impurities such as As are ion-implanted to form the N$^+$ type source region 26.

The mask 56 is thereafter removed and another mask 57 is formed. The mask 57 exposes the P$^+$ type contact region 27. P type impurities such as boron are ion-implanted. The contact region 27 may be formed before the source region 26 is formed. Further, the source region 26 and contact region 27 may be formed before the trench is formed.

Figure 9:
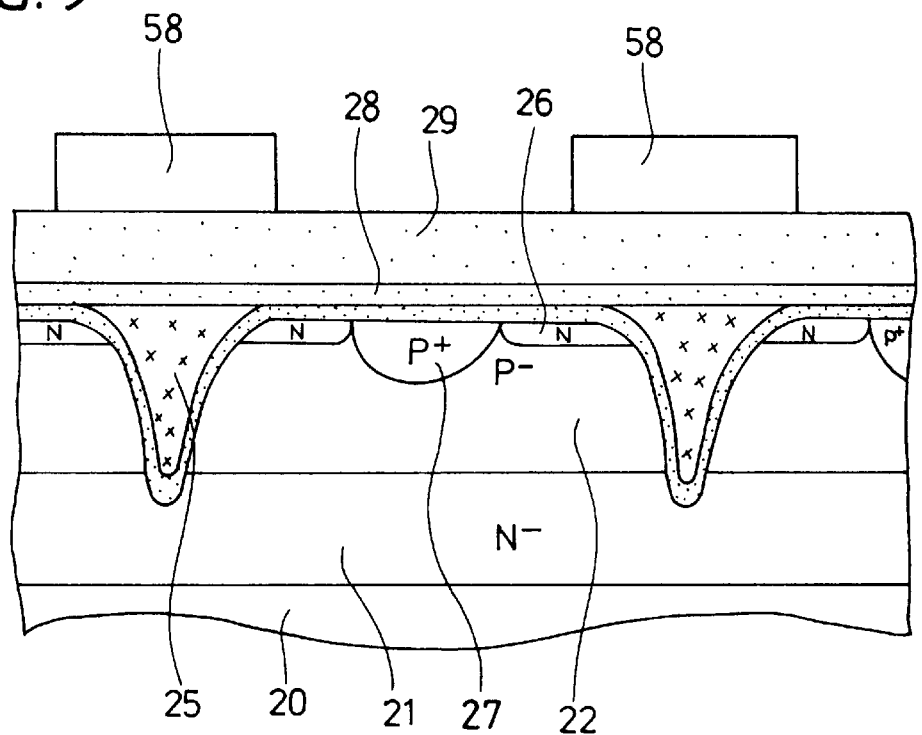
FIG. 9 is a sectional view for explaining a method of fabricating a semiconductor device which is the first embodiment of the present invention.

As shown in FIG. 9, an NSG film, a BPSG film and so on, as an insulating layer 29, are formed successively. An area corresponding to the contact region is exposed by photoresist 58. Any other insulating layer such as SOG may be used as an insulating layer.

Finally, as shown in FIG. 10, etching is carried out through resist 58 to form the contact region. Thereafter, an electrode 30 is formed on the entire surface.

Thus, the γ trench can be completed to decrease the switching time T of a transistor.

Specifically, in the switching time T which can be defined as T αR (C$_{gs}$+C$_{gd}$), the values of C$_{gs}$ and C$_{gd}$ depend on the surface area of the gate insulating layer (C$_{gs}$+C$_{gd}$=C$_{iss}$). In this case, since the surface area can be reduced, the switching speed can be improved.

Figures 22, 23:
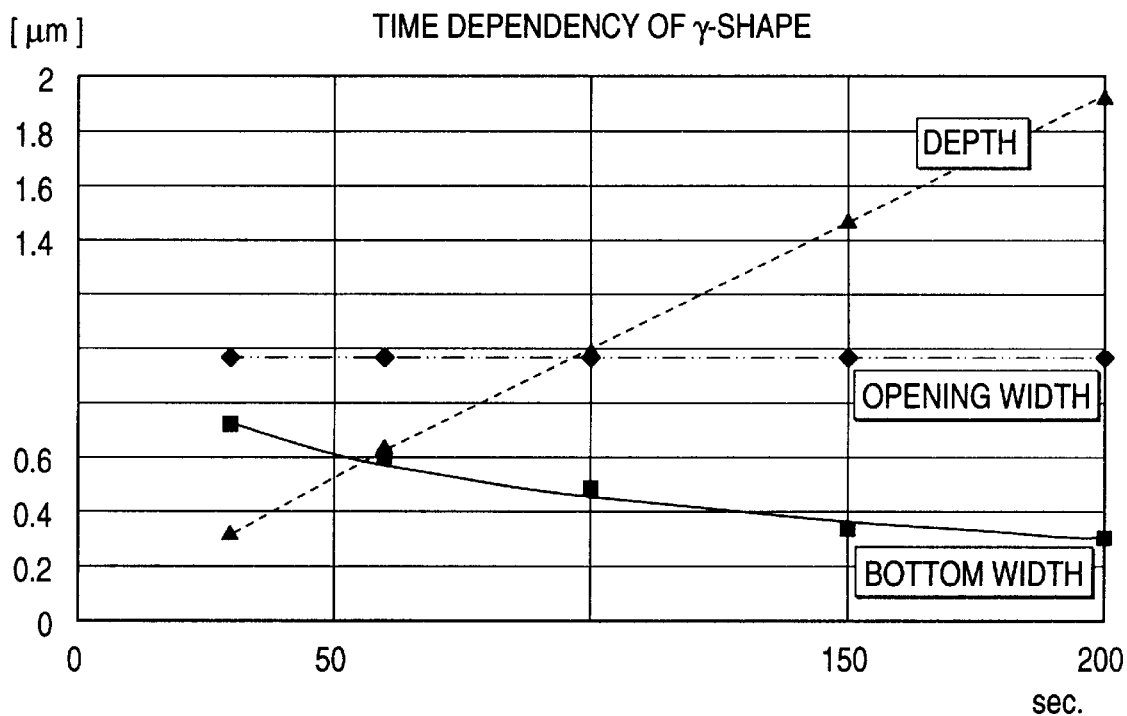
FIG. 22 is a graph showing the time dependency of a shape of a γ-trench.
FIG. 23 is a graph showing the time dependency of a shape of a γ-trench.

FIGS. 17–21 show another process of making the trench in another embodiment in which the anisotropic etching is carried out from the outset, i.e. the shape of the γ trench formed at the times of passage of 30 sec, 60 sec, 100 sec, 150 sec and 200 sec from the outset respectively. FIG. 22 is a graph showing the progress of the γ-shape. FIG. 23 is a table showing actual numerical values at the center of the wafer.

Figure 13C:
Figure 13D:
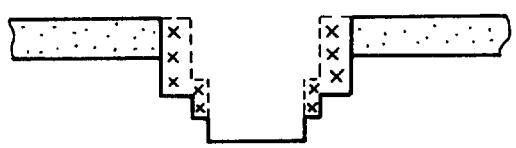
Figure 13E:
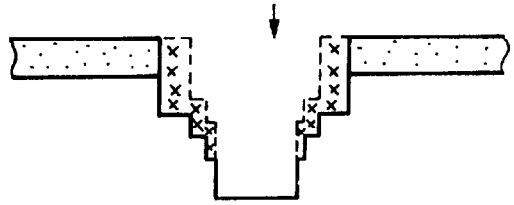

In order to fabricate the semiconductor device according to the present invention, a parallel plate type plasma anisotropic etching device is adopted. The native oxide layer is removed to form an opening by etching of complete anisotropy using a gas of HBr and N$_2$, that is initial breakthrough. Main etching is carried out through the opening. The etching gas is HBr of a main etching gas, mixed with He, O$_2$ and N$_2$. The gas of HBr, which is stronger in anisotropy than NF$_3$ and permits a deposit film to be easily applied to the side wall owing to plasma reaction, performs the etching in a depth direction. As shown in FIGS. 13C–13E, the etching is made in a slightly more narrow width than the width of the opening masked with the deposit having a thickness. The deposit is further applied to the side wall newly created and having a narrow width. Due to this deposit, a more narrow trench is further created. When steps of such etching are repeated, the side of the trench created has a slope of γ shape. It has been found that the degree of convex shape of the γ-trench increases as the quantity of HBr increases and a bottom width of the γ-trench decreases.

It can be seen from FIG. 22 that the width OP of the opening remains substantially the same value. The width BT of the bottom varies greatly at the initial stage and thereafter the variation rate decreases gradually. Namely, the lower portion of the trench, overlapping the drain region, approaches the right angle gradually.

If the γ-trench is formed with the opening size equal to that of the U-shape trench, the width of the bottom can be decreased by squeezing.

In both processes of making the trench described above, C$_{rss}$ can be decreased to a greater degree when the gate overlaps the drain region at the extreme tip of the bottom of the trench.

The features of the embodiments of the present invention described above can be summarized as follows.

(1) The slope of the γ trench is convex toward the inside of the trench so that the width of the bottom of the trench can be reduced. Particularly, the convex slope toward above from a dotted line connecting point S to point d permits the channel length length to be increased, and hence the short channel effect to be suppressed.

(2) By causing the trench to have an angle of 80–90° in the vertical vicinity of the lower end of the channel region (surface of the N$^-$ type layer), even if the depth of the trench varies, a variation in C$_{gd}$=C$_{rss}$ can be suppressed.

(3) When the bottom is formed as a point like a V-trench, an electric field is concentrated to the point. The bottom is therefore required to have a certain width. Namely, the rate of reduction of the width of the bottom is preferably within a range from 10% to 75%. The crossing of the bottom and side is required to be "Round" for improvement of the withstand voltage.

Figure 24:
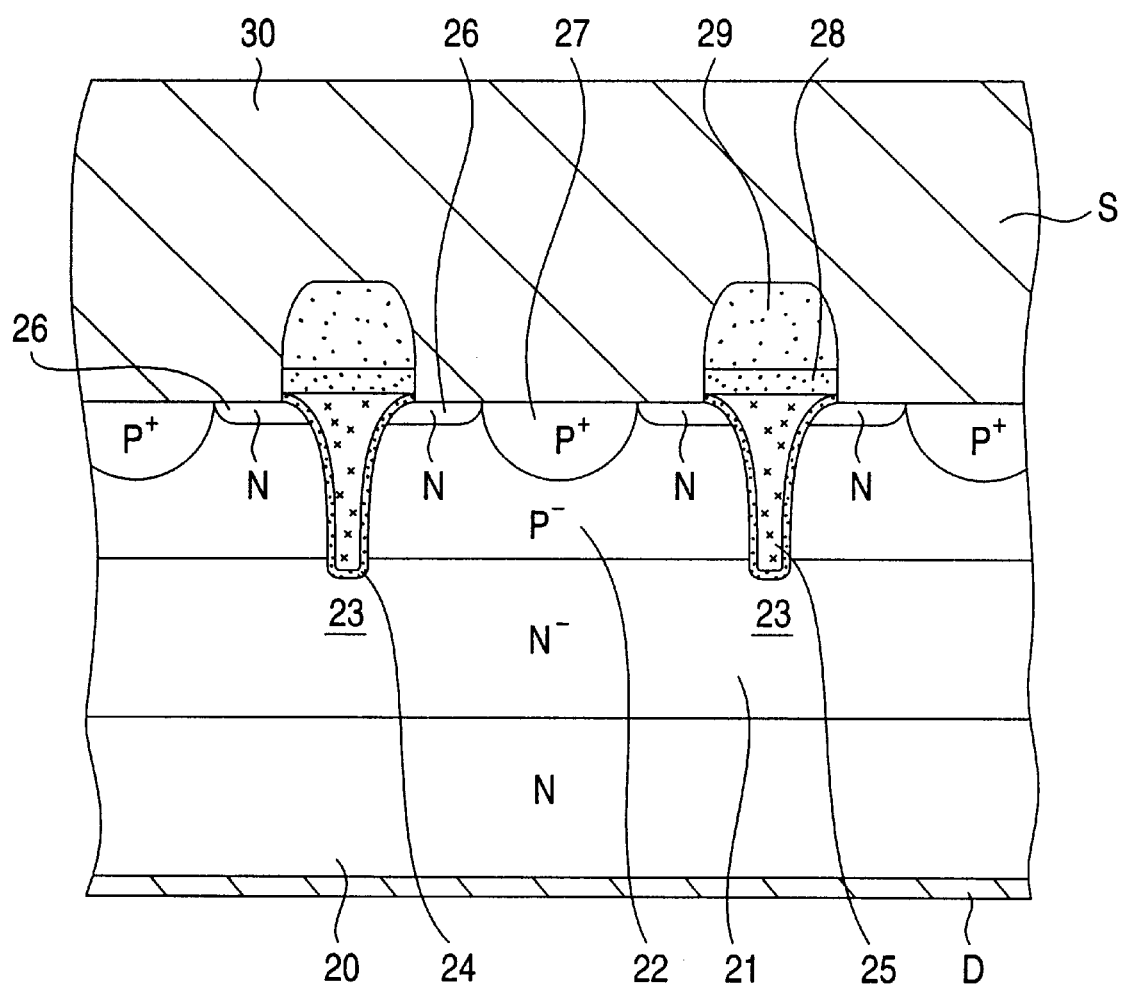
FIG. 24 is a sectional view for explaining a semiconductor device which is a second embodiment of the present invention.

Next, the second embodiment is explained. As shown in FIG. 24, the MOS FET is characterized in that in a vertical type MOS semiconductor device having a trench, the trench is substantially vertical(Refer to FIG. 24) in the vertical vicinity of the lower end of the channel region. Another structure is as same as the first embodiment as shown in FIG. 10. Although in FIG. 10, drain electrode D is not shown, a drain electrode D is formed on a rear surface of the N type silicon substrate 20 in both of the first and second embodiments. According to this structure, channel length is possible to be lengthened more surely and thereby a breakdown voltage between source and drain is improved.

As described above, in accordance with the present invention, provision of the γ-shape trench permits C$_{gs}$ and C$_{gd}$ to be reduced, thereby improving the switching speed. Further, since etching is carried out without varying the size of the surface of the opening, a depression of capacitance is possible in the same pitch of cells increase in the pitch of cells can be prevented.

Further, since the trench has a slope which is convex toward above from the line connecting point S to point d, the channel length can be increased to prevent the short channel effect.

Since the area of the trench, when it is cut horizontally, has an increasing rate toward the surface of the semiconductor substrate and a substantially zero increasing rate in the vertical vicinity of the lower end of the channel region, even if the depth of the trench varies slightly, a variation in C$_{gd}$=C$_{rss}$ can be suppressed.

Since the bottom of the trench has a reduction rate of 10%–75%, an electric field is prevented from being concentrated at the bottom, thus preventing breakage of the transistor.

Further a plurality of trenches can be arranged in a chip.

What is claimed is:

1. A semiconductor device comprising:
a trench formed in a semiconductor layer;
a gate oxide layer formed on an inner wall of said trench;

a gate conductor material embedded in said trench covered with the gate oxide layer; and a channel region formed in a boundary of said semiconductor layer with said gate oxide layer, wherein the inner wall of the trench extending from the bottom of said trench to the surface of the semiconductor layer has a curve, and an angle of a tangent line of said curve with respect to the surface of said semiconductor layer decreases constantly from the vicinity of a lower end of said channel region toward the surface of said semiconductor layer.

2. The semiconductor device as claimed in claim 1, wherein said semiconductor layer is a first semiconductor layer of a first conduction type and said semiconductor device further comprises:
- a source region of an opposite conduction type formed on a surface of said first semiconductor layer;
- a drain region of a second semiconductor layer of an opposite conduction type formed on a rear surface of said first semiconductor layer.

3. A semiconductor device comprising a semiconductor substrate including a first layer having a first conduction type and serving as a drain region, a second layer formed on said first layer and having the first conduction type more lightly doped than the first layer, and a third layer formed on the second layer, having a second conduction type opposite to the first conduction type and serving as a channel region;

- a trench formed in a grid pattern which extends from said third layer located on a surface of said semiconductor substrate to said second layer;
- a conductive material serving as a gate embedded in said trench covered with an insulating layer formed on an inner surface of said trench; and
- a source region having the first conduction type formed in the surface of said third layer corresponding to a region surrounded by an opening of said trench, wherein the inner wall of the trench extending from a bottom of said trench to the surface of the semiconductor layer has a curve, and an angle of a tangent line of said curve with respect to the surface of said semiconductor layer decreases constantly from the vicinity of a lower end of said channel region toward the surface of said semiconductor layer.

4. The semiconductor device as claimed in claim 3, wherein an area of the trench, when the trench is cut horizontally, has an increasing rate from the lower end of said channel region toward the surface of the semiconductor layer and a substantially zero increasing rate in the vertical vicinity of the lower end of the channel region.

5. The semiconductor device as claimed in claim 3, wherein assuming that a vertical section of said trench has a length OP of an opening, a depth $D_1$, a width $BT_2$ of a bottom and a length $D_1$ of a sloping line connecting the edge of the opening to that of the bottom, $2\times D_2+BT_2 < 2\times D_1+OP$.

6. The semiconductor device as claimed in claim 4, wherein a bottom of said trench overlaps the vicinity of the surface of said second layer.

7. A vertical type MOS semiconductor device having a trench formed in a semiconductor layer and embedded with a gate conductor material in the trench, the inner surface of which is covered with an oxide layer, wherein said trench has a sectional shape having a dimension relationship: $D_2 < D_1+(OP-BT_2)/2$ where OP: a length of an opening of the trench, $D_1$: a depth of the trench, $D_2$: a length of a curve connecting the top of the opening to a bottom of the trench, $BT_2$: a length of the bottom.

8. A vertical type MOS semiconductor device comprising:

a trench formed in a semiconductor layer;

a gate oxide layer formed on an inner surface of said trench;

a gate material embedded in the trench, the inner surface of which is covered with said gate oxide layer; and a source region (or drain region) formed on the periphery of an opening of said trench and a drain region (or source region) formed in the vicinity of a bottom of said trench, wherein said trench has a curve which is convex toward above from a line connecting point S, which is a crossing point of the bottom of said source region (or drain region) and said trench, to point d, which is a lower end of a channel formed at a boundary between said gate insulating layer and said semiconductor layer, and is substantially vertical in the semiconductor layer, and is substantially vertical in the vicinity of the lower end of the channel region.

9. The vertical type MOS semiconductor device as claimed in claim 8, wherein the bottom of said trench has a prescribed width.

10. The vertical type MOS semiconductor device as claimed in claim 9, wherein said MOS semiconductor device is a power MOS transistor.

11. The vertical type MOS semiconductor device as claimed in claim 9, wherein said MOS semiconductor device is an IGBT.

* * * * *